(12) United States Patent
Miyabe et al.

(10) Patent No.: US 6,437,608 B1
(45) Date of Patent: Aug. 20, 2002

(54) SAMPLE-AND-HOLD CIRCUIT AND A/D CONVERTER

(75) Inventors: Satoru Miyabe, Tokyo; Yasuhiro Sugimoto, 34-3, Kawawadai, Tsuzuki-ku, Yokohama, both of (JP)

(73) Assignees: Nippon Precision Circuits Inc., Tokyo; Yasuhiro Sugimoto, Kanagawa-ken, both of (JP)

( * ) Notice: Subject to any disclaimer, the term of this patent is extended or adjusted under 35 U.S.C. 154(b) by 0 days.

(21) Appl. No.: 09/992,334

(22) Filed: Nov. 6, 2001

(30) Foreign Application Priority Data

Nov. 24, 2000 (JP) .......................................... 2000-357698

(51) Int. Cl.[7] ............................. G11C 27/02; G16G 7/64
(52) U.S. Cl. ............................. 327/96; 327/94; 327/337; 330/9
(58) Field of Search ............................. 327/91, 94, 96, 327/65, 67, 77–79, 87, 337, 554; 330/9, 51; 341/122, 172

(56) References Cited

U.S. PATENT DOCUMENTS

| | | | | |
|---|---|---|---|---|
| 5,220,286 A | * | 6/1993 | Nadeem | 330/9 |
| 5,736,895 A | * | 4/1998 | Yu et al. | 327/337 |
| 5,805,019 A | * | 9/1998 | Shin | 330/9 |
| 5,973,536 A | * | 10/1999 | Maejima | 327/337 |
| 6,169,427 B1 | * | 1/2001 | Brandt | 327/94 |

* cited by examiner

*Primary Examiner*—Toan Tran
(74) *Attorney, Agent, or Firm*—Jordan and Hamburg LLP

(57) ABSTRACT

In a sample-and-hold circuit using a completely differential type operational amplifier circuit, to promote operational stability, to restrain a variation in a balance point of a middle value of differential output signals and to promote stability and accuracy of an A/D converter are achieved by a constitution as bellow. There is provided a common phase feedback circuit 2, common phase feedback hold capacitors CF1 and CF2 of which are connected to input terminals IN1 and IN2 of a completely differential type operational amplifier circuit 1, during a sample period, by way of reset switches RS1 and RS2 connecting the input terminals IN1 and IN2 and output terminals OUT1 and OUT2 of the completely differential type operational amplifier circuit 1, the common phase feedback hold capacitors CF1 and CF2 are charged to thereby determine a balance point of a middle value of differential output signals from the output terminals OUT1 and OUT2 and during a hold period, the balance point of the middle value of the differential output signals is maintained by electric charge charged to the common phase feedback hold capacitors CF1 and CF2 regardless of the differential output signals.

3 Claims, 9 Drawing Sheets

SAMPLE-AND-HOLD CIRCUIT AND A/D CONVERTER

BACKGROUND OF THE INVENTION

1. Field of the Invention

The present invention relates to a sample-and-hold circuit and an A/D (Analog to Digital) converter using the sample-and-hold circuit, particularly to a sample-and-hold circuit using a completely differential type operational amplifier circuit and an A/D converter using the sample-and-hold circuit.

2. Description of the Related Art

Currently, there is an A/D (Analog to Digital) converter using a sample-hold-circuit including a completely differential type operational amplifier circuit. For example, the sample-hold-circuit is used in an A/D converter of a pipeline system. According to the A/D converter of the pipeline system, as shown by FIG. 4, sequential values are specified by A/D conversion cells Sn through S1 for respective bits from MSB (Most Significant Bit) to LSB (Least Significant Bit) of n bits of PCM (Pulse Code Modulation) data. The A/D conversion cells $S_k$ (k=n, n−1, n−2, . . . 1) of the respective bits are provided with latches $l_{k1}, \ldots l_{kk-1}, l_{kk}$ for successively shifting values of respectively specified bits and output values of the respective bits of MSB through LSB from latches at a final stage $l_{nn}, l_{n-1n-1}, \ldots, l_{11}$ of the A/D conversion cells of the respective bits.

When the constitution of the respective A/D conversion cell $S_k$ is indicated by functional blocks, the respective A/D conversion cell $S_k$ is constituted by a comparator CO, a subtractor d0 subtracting a voltage amount in correspondence with a determination result of "1" or "0" of the comparator CO from an input and a sample-and-hold circuit shO for sampling output voltage of the subtractor d0 and outputting a double value thereof constituting 1 bit ADC (Analog to Digital Converter). At the comparator CO of an A/D conversion cell $S_n$ of 1st stage, predetermined reference voltage and input voltage are compared, when the input voltage is larger, MSB is set to be "1" and provided to a latch $l_{n1}$, a voltage amount in correspondence with MSB "1" is subtracted from input voltage by the subtractor d0, the output of the subtractor d0 is doubled by the sample-and-hold circuit sh and output voltage in correspondence with carrying the digit of the output of the subtractor d0 by 1 bit, is provided to an A/D conversion cell $S_{n-1}$, at a next stage. Similarly, at A/D conversion cells $S_{n-1}$, $S_{n-2}$, $S_l$ at and after the next stage, bits lower than MSB are determined. Values determined by the A/D conversion cells $S_n$, $S_{n-1}$, $S_l$ in accordance with a predetermined sampling clock, are shifted at respective latch stages in accordance with a sampling clock, not illustrated, and values of respective bits of MSB through LSB are outputted from the final stage.

In an actual A/D conversion cell, there is used a sample-and-hold circuit having a completely differential type operational amplifier circuit and is constructed by a constitution having functions of the subtractor d0 and the sample-and-hold circuit sh0. According to the constitution, as shown by FIG. 5, a first switch capacitor net CS1 is provided between a first input terminal IN1 constituting a negative input terminal of a completely differential type operational amplifier circuit 51 and a first output terminal OUT1 constituting a positive output terminal thereof and a first reset switch RS1 is provided between the first input terminal IN1 and the first output terminal OUT1. The first switch capacitor net CS1 is constituted by capacitors C1 and C2 one terminal of each of which is connected to the first input terminal IN1, a switch SW1 for selectively connecting other terminal of the capacitor C1 to an input terminal IN0 of the sample-and-hold circuit, a reference voltage terminal Ref or the first output terminal OUT1 and a switch SW2 for selectively connecting other terminal of the capacitor C2 to the input terminal IN0 of the sample-and-hold circuit sh1, a reference voltage terminal Ref or the first output terminal OUT1 constituting the positive output terminal of the completely differential type operational amplifier circuit 51. A second switch capacitor net CS2 similar to the first switch capacitor net CS1 is provided between a second input terminal IN2 constituting a positive input terminal of the completely differential type operational amplifier circuit 51 and a second output terminal OUT2 constituting a negative output terminal and a second reset switch RS2 is provided between the second input terminal and the second output terminal. The second switch capacitor net CS2 is constituted by capacitors C1' and C2' having an equal capacitance value, one terminal of each of which is connected to the second input terminal IN2, a switch SW3 for selectively connecting other terminal of the capacitor C1' to an input terminal IN0' constituting other of differential input terminals of the sample-and-hold circuit, the reference voltage terminal Ref' and the second output terminal OUT2, and a switch SW4 for selectively connecting other terminal of the capacitor C2' to an input terminal IN0' constituting other of the differential input terminals of the sample-and-hold circuit sh1, the reference voltage terminal Ref and the second output terminal OUT2 constituting a negative output terminal of the completely differential type operational amplifier circuit 1.

As shown by FIG. 6, the sample-and-hold circuit sh1 constitutes the A/D conversion cell $S_k$ by connecting an input terminal of the comparator CO to the input terminals IN0 and IN0'. During a hold period, mentioned later, the above-described subtracting operation can be carried out by controlling the switches SW1 and SW2 of the first switch capacity net CS1 and the switches SW3 and SW4 of the second switch capacity net CS2 by the output of the comparator CO. The A/D conversion cell $S_k$ is connected to the A/D conversion cell $S_{k-1}$ at a successive stage by connecting the similar input terminals IN0 and IN0' of the sample-and-hold circuit sh1 and the comparator CO of the A/D conversion cell $S_{k-1}$ to the output terminals OUT1 and OUT2 of the sample-and-hold circuit sh1 to thereby constitute the A/D converter of the pipeline system shown in FIG. 4.

Details of operation of the sample-and-hold circuit sh1 are as follows.

During a sample period, as shown by FIG. 7A, the first and the second reset switches RS1 and RS2 are made ON and in the first switch capacitor net CS1, the capacitors C1 and C2 are conducted between the input terminal IN0 and the input terminal IN1 in parallel. Also in the second switch capacitor net CS2, the capacitors are connected similarly. When voltage of the input terminal IN1 is designated by notation Vt, input voltage inputted to the input terminal IN0 is designated by notation Vin and the capacitance values of the capacitors C1 and C2 are equally designated by notation C, a total sum Q of electric charge stored in the capacitors C1 and C2, is represented as follows.

$$Q=2C(V_{in}-V_t) \quad (1)$$

During the hold period, as shown by FIG. 7B, the first and the second reset switches RS1 and RS2 are made OFF, in the first switch capacitor net CS1, in accordance with the output of the comparator CO, the other terminal of the capacitor C1 is blocked from the input terminal IN0 and conducted to the reference voltage terminal Ref, and the other terminal of the capacitor C2 is blocked from the input terminal IN0 and conducted to the first output terminal OUT1 or the other terminal of the capacitor C2 is blocked from the input terminal IN0 and conducted to the reference voltage terminal Ref and the other terminal of the capacitor C1 is blocked from the input terminal IN0 and conducted to the first output terminal OUT1. The second switch capacitor net CS2 is connected similarly. When voltage of the reference voltage terminal Ref is designated by notation Vref and voltage of the first output terminal OUT1 is designated by notation Vout, the total sum Q of electric charge stored in the capacitors C1 and C2, is represented as follows.

$$Q = C(V_{ref} - V_t) + C(V_{OUT} - V_t) = C(V_{ref} + V_{out}) - 2CV_t \quad (2)$$

The total sum of electric charge during the sample period and the hold period is preserved as follows.

$$Q = 2C(V_{in} - V_t) = C(V_{ref} + V_{out}) - 2CV_t \quad (3)$$

When Vref=0, 2Vin=Vout to thereby output a double value of a sampled value. According to the case, the output of the comparator CO is "0", which corresponds to a case in which subtraction by the subtractor d0 is not needed. When the output of the comparator CO is "1" and subtraction by the subtractor d0 is needed, subtracting operation is realized by constituting Vref by a pertinent value Vref'. That is, the switch SW2 is made ON to a side of the reference voltage terminal Ref' constituting voltage by Vref' in place of the reference voltage terminal Ref. Also with regard to the second switch capacitor net CS2 and the second reset switch RS2 between the second input terminal IN2 and the second output terminal OUT2, the operation is similar. However, owing to the difference of the polarity, in the hold period, when the output of the comparator CO is "0", the other terminal of the capacitor C1' is connected to Ref' and applied with Vref' and when the output of the comparator CO is "1", the other terminal of the capacitor C2' is connected to Ref and applied with Vref. Further, actually, the output of the completely differential type operational amplifier circuit is provided with an offset and vref and Vref' are set to values for canceling the offset (for example, Vref=0.5V, Vref'=1.5V).

Now, the completely differential type operational amplifier circuit 51 is provided with one set of differential output terminals comprising the first output terminal OUT1 for amplifying and outputting a difference between input signals inputted to the first and the second input terminals IN1 and IN2 constituting one set of the differential input terminals, and a second output terminal OUT2 for invertedly amplifying and outputting the difference between the input signals. The differential input terminals sample only the relative difference of one set of the input signals as a signal component. On the other hand, the differential output terminals output a result of amplifying the relative difference of the one set of input signals in a relative difference of one set of the output signals. However, in such a state as it is, a middle value (absolute value) of the one set of differential output signals is not determined uniquely. Hence, as shown by FIG. 5, a common phase feedback circuit 52 is provided between the first output terminal OUT1 and the second output terminal OUT2, an output bias circuit at inside of the completely differential type operational amplifier circuit 51 is controlled by an output bias control signal generated at a control terminal c1 to thereby uniquely maintain the middle value of the one set to differential output signals.

FIG. 8 exemplifies an output portion of inside of the completely differential type operational amplifier circuit 51. The output portion comprises a cascode amplifying circuit 81 and a central value of the one set of differential output signals is controlled by an output bias control signal provided to an output bias circuit 82 thereof. The common phase feedback circuit 52 receives outputs from the output terminals OUT1 and OUT2 constituting one set of the differential output signals of the completely differential type operational amplifier circuit 51, and feeds back the output bias control signal operated to restrain a variation in the central value of the one set of differential output signals and maintain the central value to be a constant value, to the output bias circuit 82 of the completely differential type operational amplifier circuit 51.

FIG. 9, FIG. 10 and FIG. 11 show examples of common phase feedback circuits. One set of differential output voltages (for convenience, designated by notations Vx, Vy) of a completely differential type operational amplifier circuit, are made to commonly constitute inputs of the common phase feedback circuits. Consider circuit operation when the circuit of FIG. 9 is used as the common phase feedback circuit 52. When a balance point of a middle value of differential output signals of a completely differential type operational amplifier circuit in this feedback system, is set to $(Vx+Vy)/2 = V_0$ and a sum of currents flowing in MOS transistors M1 and M2 at this occasion, is designated by notation $I_0$. Now, when the middle value of the differential output signals is increased from $V_0$ by $\Delta V$, the sum of the currents flowing in the MOS transistors M1 and M2, is increased by $\Delta I$ relative to $I_0$. The current increase brings about an increase in an output drawing current value of the completely differential type operational amplifier circuit via a current mirror constituted by a transistor M3 and an output bias circuit to thereby reduce the middle value of the differential output signals. Similarly, when the middle value is reduced from $V_0$ by $\Delta V$, the feedback system increases the middle value of the differential output signals.

In this way, by using the circuit of FIG. 9 as the common phase feedback circuit 52, there is achieved an effect of restraining the central value of the differential output signals of the completely differential type operational amplifier circuit from being varied and maintaining the middle value to a constant value.

However, the constitution of the common phase feedback circuit of FIG. 9 includes the following problem. That is, in the differential output signals of the $Vx=(V_0+v)$ and $Vy=(V_0-v)$ when the differential output amplitude v is increased, regardless of the fact that $(Vx+Vy)/2 = V_0$, the sum of the currents flowing in the MOS transistors M1 and M2, is shifted from $I_0$ depending on v. The problem is explained as follows. Drain voltages of the transistors M1 and M2 are higher than the gate voltages Vx and Vy of the MOS transistors M1 and M2 and therefore, the MOS transistors M1 and M2 are brought into saturated regions. At this occasion, when gate/source voltages of the MOS transistors M1 and M2 are designated by notations Vgs1 and Vgs2 and drain currents thereof are respectively designated by notations Ids1 and Ids2, the following equation is established.

$$I_{ds1} + I_{ds2} = \frac{\beta}{2}\{(V_{gs1} - Vth)^2 + (V_{gs2} - Vth)^2\} \quad (4)$$

(notation $\beta$ designates constant, notation Vth designates threshold voltage of transistor)

When a total sum of the currents in the case in which the output central value is designated by notation $V_0$ and Vgs1=

Vgs2≡Vgs, is designated by notation $I_0$, the following equation is established.

$$I_0 = \beta(V_{gs} - Vth)^2 \quad (5)$$

Now, when Vgs1=Vgs+ΔV, Vgs1=Vgs−ΔV, the middle value is not changed by ΔV and accordingly is $V_0$ and the current at this occasion is as follows.

$$I_{ds1} + I_{ds2} = \frac{\beta}{2}\{(V_{gs1} - Vth + \Delta V)^2 + (V_{gs2} - Vth + \Delta V)^2\} \quad (6)$$

$$= \beta(V_{gs} - Vth)^2 + \beta \cdot \Delta V^2 = I_0 + \beta \cdot \Delta V^2$$

The above equation indicates that when the amplitude of the differential output signal of the completely differential type operational amplifier circuit is large, even in the case in which the middle value of the differential output signals is $V_0$, the sum of currents flowing in the MOS transistors M1 and M2 is shifted from $I_0$. The change of current is fed back to the output bias circuit of the completely differential type operational amplifier circuit and brings about a change in the middle voltage value $V_0$. In this way, it is known that there poses the problem that the balance point is varied depending on the output amplitude when the common phase feedback circuit of FIG. 9 is used in FIG. 5.

According to the constitution of FIG. 10, in order to control the central value $V_0$ of the differential output signals by outside applied voltage $V_{cm}$, transistors M4, M5 and M6 and two current sources are added to the common phase feedback circuit shown in FIG. 9 to thereby construct differential constitution. However, in order to construct the differential constitution, transistors M1, M2, M4 and M5 are MOS transistors having a polarity reverse to that of transistors M3 and M6. In correspondence with the inversion of polarities, not the transistor M3 but the transistor M6 provides a feedback path to the output bias circuit. Also in the circuit constitution, a relationship between the change of gate voltage of the transistors M1 and M2 and the sum of currents flowing in the transistors M1 and M2, is essentially the same as the discussion on the circuit of FIG. 9 and there poses a problem that the balance point is varied by the output amplitude also in the constitution of FIG. 10.

Still other constitution of the common phase feedback circuit is shown in the constitution of FIG. 11. According to the constitution, drain voltages of the MOS transistors M1 and M2 are sufficiently lower than the differential output signals Vx and Vy of the completely differential type operational amplifier circuit and accordingly, the MOS transistors M1 and M2 are operated in linear regions. Output resistance R of the MOS transistor in the linear region is represented as follows.

$$R = \frac{1}{\partial I_{ds}/\partial V_{ds}} = \frac{1}{\beta(V_{gs} - Vth + V_{ds})} \approx \frac{1}{\beta(V_{gs} - Vth)} \quad (7)$$

Therefore, an output resistance value $R_0$ viewing from a common drain of the MOS transistors M1 and M2 gate/source voltages of which are respectively Vx and Vy, is provided by parallel connection of respective output resistors of the MOS transistors M1 and M2 and is represented as follows.

$$R_0 \approx \frac{1}{\beta(V_X + V_Y - 2Vth)} \quad (8)$$

Now, when the differential output signals are put as Vx=($V_0$+v) and Vy=($V_0$−v), the following equation is established irrespective of the magnitude of the amplitude v.

$$R_0 \approx \frac{1}{\beta(2V_0 - 2Vth)} \quad (9)$$

By feeding back the output resistance value as a source resistance value of the output bias circuit of the completely differential type operational amplifier circuit, the middle value of the differential output signals of the completely differential type operational amplifier circuit can be maintained at the balance point. That is, for example, when the middle value of the differential output signal is increased, $R_0$ is reduced and by reducing the source resistance value $R_0$ of the output bias circuit, drawing current is increased to thereby restrain the middle value of the differential output signals from increasing. According to the common phase feedback circuit of FIG. 11, in comparison with the common phase feedback circuits of FIG. 9 and FIG. 10, dependency of the differential output signals on the amplitude v is extremely small and in the approximation equation of $R_o$, the dependency on the amplitude v can be disregarded.

However, when the circuit of FIG. 11 is used at low power source voltage, (Vx+Vy−2Vth) is not sufficiently larger than Vds. The drain voltage Vds of the MOS transistors M1 and M2 is also source voltage of the output bias circuit and the source voltage is influenced by the amplitude of the differential output signal. When the drain voltage Vds is changed, $R_0$ is changed to thereby change the middle value of the differential output signals, however, the change is fed back to $R_0$ as the change of the value of (Vx+Vy) and varies $R_0$ further. In this way, it is known that there poses a problem of varying the balance point of the middle value of the differential output signals by the amplitude of the differential output signals of the completely differential type operational amplifier circuit even in the common phase feedback circuit of FIG. 11.

From the above-described, the following problem is posed in the sample-and-hold circuit sh1. First, consider a case in which the balance point of the middle value of the differential output signals is not varied by the amplitude of the differential output signals of the completely differential type operational amplifier circuit 51. The capacitors C1 and C2 during the sample period, are provided with direct current paths to both of two terminals connected in parallel with each other. Therefore, the capacitors C1 and C2 store electric charge in accordance with a potential difference of the two terminals. During the hold period, the one terminal of each of the capacitors C1 and C2 is connected to the first input terminal of the completely differential type operational amplifier circuit which is not provided with a direct current path. Therefore, in the hold period, the total sum of electric charge stored in the capacitors C1 and C2 is preserved. As mentioned above, the total sum Q of electric charge stored in the capacitors C1 and C2 is represented as follows.

$$Q = C(V_{ref} - V_t) + C(V_{OUT} - V_t) = C(V_{ref} + V_{OUT}) - 2CV_t \quad (10)$$

Next, consider a case in which the balance point of the middle value of the differential output signals is varied by $\Delta V_0$ by the amplitude of the differential output signals of the completely differential type operational amplifier circuit. A connected state of the circuit during the sample period is brought into a reset state similar to the case in which $\Delta V_0$ is null and therefore, electric charge the same as that represented by Equation (10) is stored. In the hold period, the balance point is varied by $\Delta V_0$ depending on the amplitude of the differential output signals. When voltage of the first input terminal of the completely differential type operational amplifier circuit at this occasion, is designated by notation Vt', a total sum Q' of electric charge stored in the capacitors C1 and C2 becomes as follows.

$$Q' = C(V_{ref} - V_t') + C(V_{out} + \Delta V_0 - V_t') = C(V_{ref} + V_{out}) + C(\Delta V_0 - 2V_t') \quad (11)$$

A final total amount of electric charge stored in the sample period is also preserved in the hold period and accordingly, Q=Q' must be established. The following equation is derived from Equation (10) and Equation (11).

$$V_t' = V_t + \frac{\Delta V_0}{2} \quad (12)$$

The above equation indicates that the variation of the balance point of the output central value which depends on the output amplitude of the completely differential type operational amplifier circuit 51, is positively fed back to the first input terminal IN1 of the completely differential type operational amplifier circuit 51 during the hold period. That is, it is known that although in the sample-and-hold circuit sh1, the feedback connection method by the reset switch or the capacitor C1 or the capacitor C2 and the feedback connection method by the common phase feedback circuit for stabilizing the output middle point to the predetermined balance point, are all negative feedback connection, the variation of the balance point per se necessarily becomes positive feedback. The positive feedback is provided similarly to the second input terminal IN2 of the completely differential type operational amplifier circuit 51 and therefore, most of the positive feedback is removed by the differential amplifying operation and therefore, adverse influence is not effected immediately, however, the positive feedback is not preferable in view of stabilizing the feedback system. In addition thereto, the variation of the balance point of the middle value of the differential output signals, causes erroneous determination of the comparator at the successive stage.

In this way, according to the conventional sample-and-hold circuit using the completely differential type operational amplifier circuit for connecting the common phase feedback circuit between the first and the second output terminals OUT1 and OUT2 as shown by FIG. 5, there poses the problem in view of stability and in view of accuracy.

SUMMARY OF THE INVENTION

According to an aspect of the invention, there is provided a sample-and-hold circuit comprising a completely differential type operational amplifier circuit, a first reset switch connected between a first input terminal constituting one of differential input terminals of the completely differential type operational amplifier circuit and a first output constituting one of differential output terminals of the completely differential type operational amplifier circuit, a second reset switch connected between a second input terminal constituting other of the differential input terminals of the completely differential type operational amplifier circuit and a second output terminal constituting other of the differential output terminals of the completely differential type operational amplifier circuit, a first switch capacitor net connected between the first input terminal and the first output terminal and having a third input terminal, and a second switch capacitor net connected between the second input terminal and the second output terminal and having a fourth input terminal, wherein the sample-and-hold circuit is a sample-and-hold circuit constituting one set of differential input terminals by the third and the fourth input terminals and constituting one set of differential output terminals by the first and the second output terminals, further comprising a common phase feedback circuit having a first and a second common phase feedback hold capacitor respectively connected to the first input terminal and the second input terminal and maintaining a middle value of output voltages of the first and the second output terminals to a predetermined value in accordance with voltages of the first and the second input terminals.

It is preferable that in the common phase feedback circuit, the first input terminal is connected to a gate terminal of a first MOS transistor and the first common phase feedback hold capacitor, other terminal of the first common phase feedback hold capacitor is grounded, a source terminal of the first MOS transistor is grounded or connected to a power source terminal, the second input terminal is connected to a gate terminal of a second MOS transistor and the second common phase feedback hold capacitor, other terminal of the second common phase feedback hold capacitor is grounded, a source terminal of the second MOS transistor is grounded or connected to a power source terminal, a drain terminal of the first MOS transistor and a drain terminal of the second MOS transistor are connected to thereby constitute a control terminal and the middle value of the output voltage of the first and the second output terminals is maintained to the predetermined value in accordance with an output from the control terminal.

According to an A/D converter of the invention, it is preferable to constitute an A/D converter of a pipeline system, wherein in a plurality of the above mentioned sample-and-hold circuits, the differential output terminals of the sample-and-hold circuit at a preceding stage are connected to the sample-and-hold circuit at a successive stage as the differential input terminals and an output of a point of connecting the differential output terminal and the differential input terminal, is compared with a predetermined reference value to thereby provide values of respective bits of PCM data.

DETAILED DESCRIPTION OF THE PREFERRED EMBODIMENTS

Figure 1:
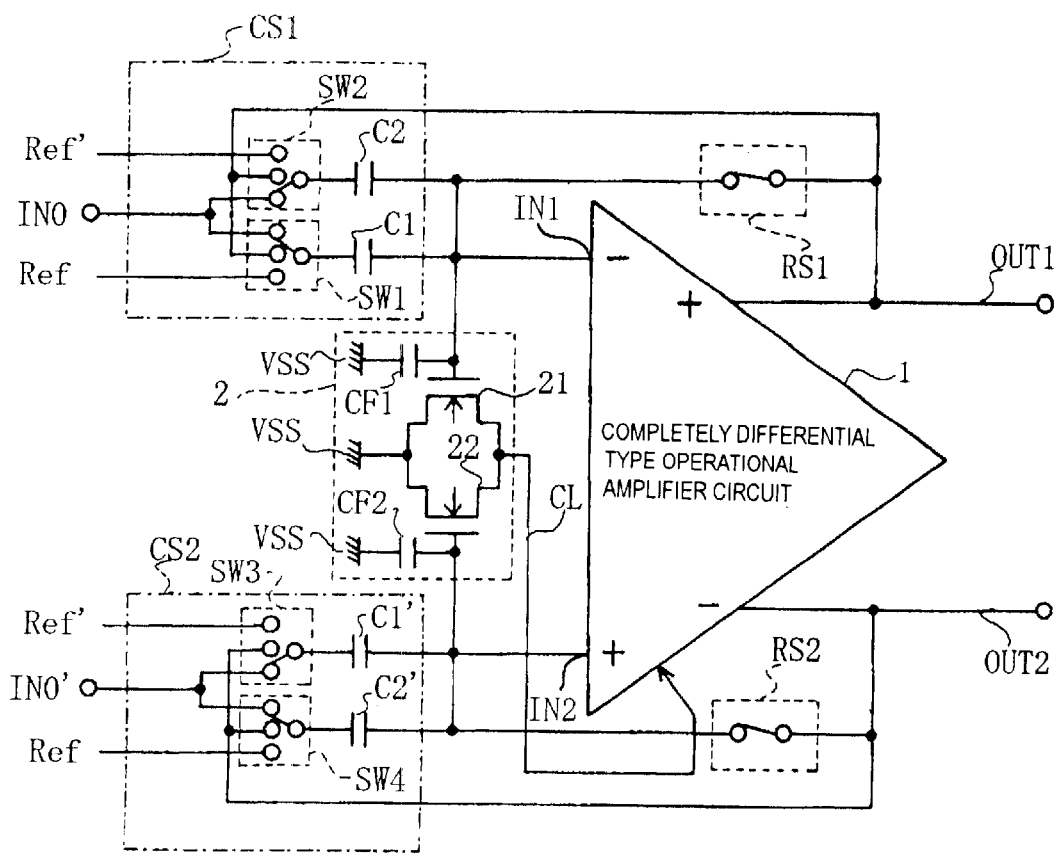
FIG. 1 is a circuit diagram showing a constitution of a sample-and-hold circuit according to an embodiment of the invention.

A detailed explanation will be given of a mode of carrying out the invention based on embodiments as follows. FIG. 1 is a circuit diagram showing a constitution of a sample-and-hold circuit of an embodiment of the invention. A first switch capacitor net CS1 is provided between a first input terminal IN1 constituting a negative input terminal of a completely differential type operational amplifier circuit 1 and a first output terminal OUT1 constituting a positive output terminal and a first reset switch RS1 is provided between the first input terminal IN1 and the first output terminal OUT1. A second switch capacitor net CS2 is provided between a second input terminal IN2 and a second output terminal OUT2 and a second reset switch RS2 is provided between the second input terminal IN2 and the second output terminal OUT2.

The first switch capacitor net CS1 is constituted by capacitors C1 and C2 having an equal capacitance value, one end of each of which is connected to the first input terminal IN1, a switch SW1 for selectively connecting other terminal of the capacitor C1 to an input terminal IN0 constituting one of differential input terminals of the sample-and-hold circuit, a reference voltage terminal Ref and the first output terminal OUT1 and a switch SW2 for selectively connecting other terminal of the capacitor C2 to the input terminal IN0 constituting the one of the differential input terminals of the sample-and-hold circuit, a reference voltage terminal Ref' and the first output terminal OUT1 constituting a positive output terminal of the completely differential type operational amplifier circuit 1.

The second switch capacitor net CS2 is constituted by capacitors C1' and C2' having an equal capacitance value, one terminal of each of which is connected to the second input terminal IN2, a switch SW3 for selectively connecting other terminal of the capacitor C1' to an input terminal IN0' constituting other of the differential input terminals of the sample-and-hold circuit, the reference voltage terminal Ref' and the second output terminal OUT2, and a switch SW4 for selectively connecting other terminal of the capacitor C2' to the input terminal IN0' constituting the other of the differential input terminals of the sample-and-hold circuit, the reference voltage terminal Ref and the second output terminal OUT2 constituting a negative output terminal of the completely differential type operational amplifier circuit 1.

Figure 8:
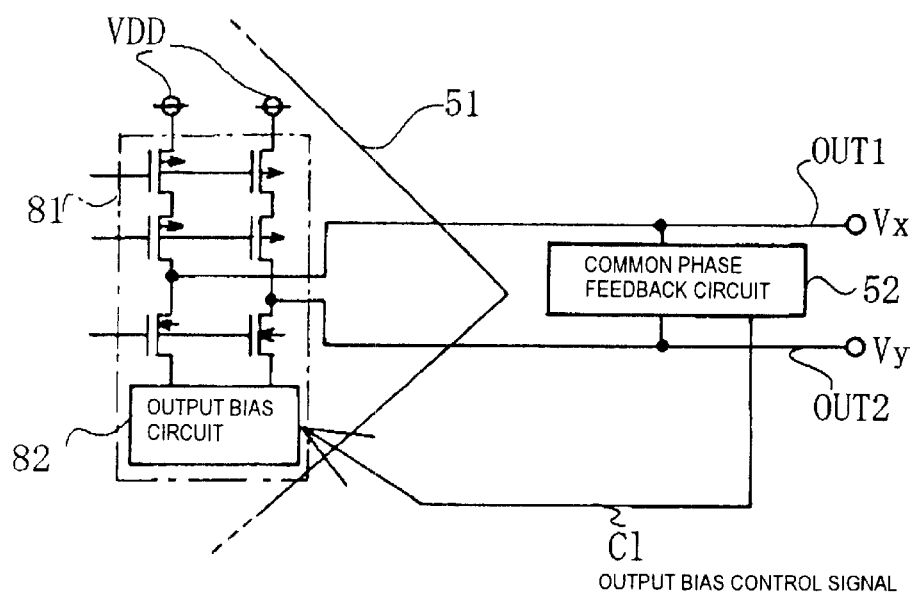
FIG. 8 is a block diagram showing a constitution of an output portion of the sample-and-hold circuit of FIG. 5.
Figure 9:
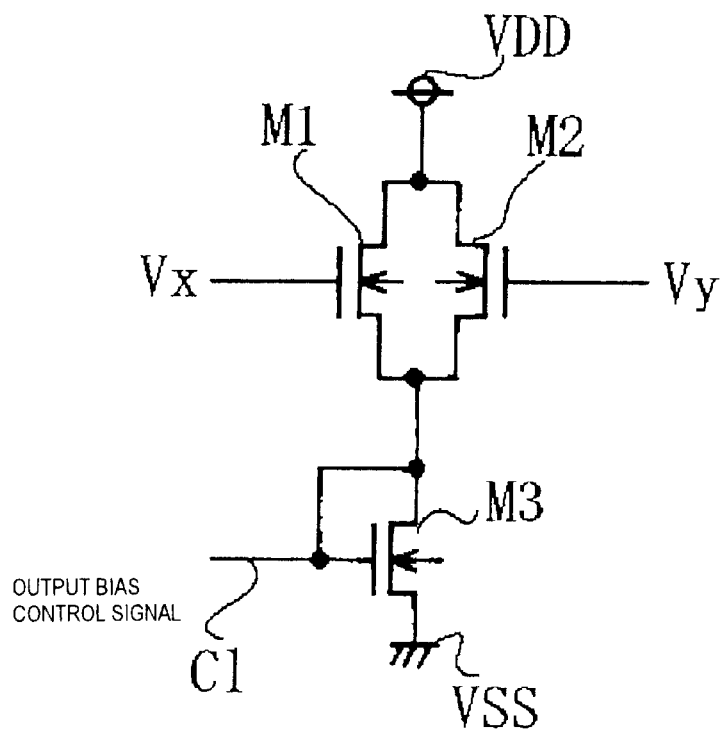
FIG. 9 is a circuit diagram showing an example of a constitution of a common phase feedback circuit of the sample-and-hold circuit of FIG. 5.
Figure 10:
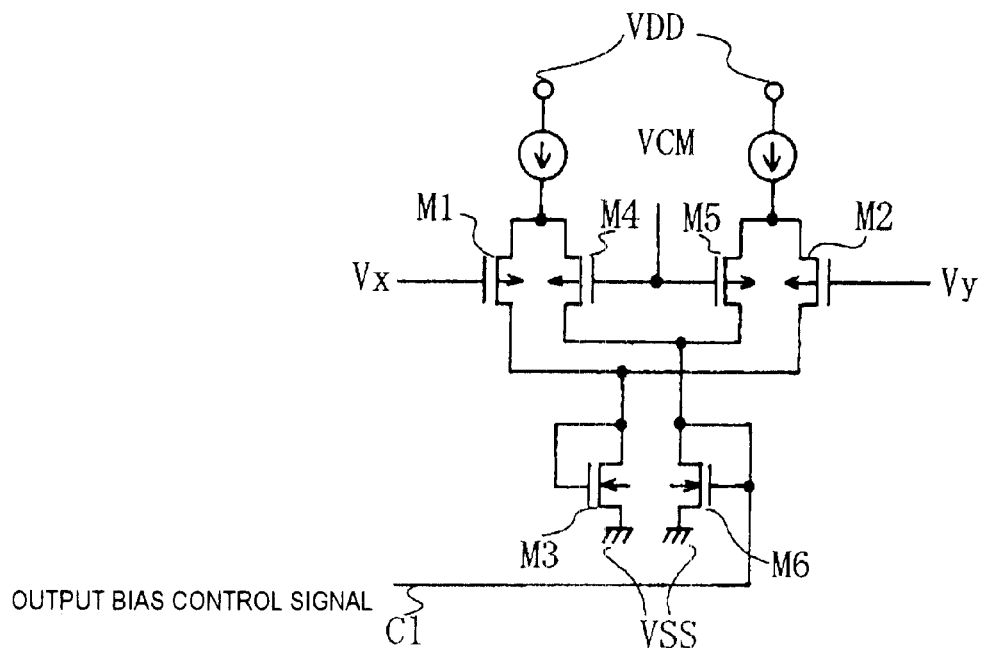
FIG. 10 is a circuit diagram showing other example of a constitution of a common phase feedback circuit of the sample-and-hold circuit of FIG. 5.
Figure 11:
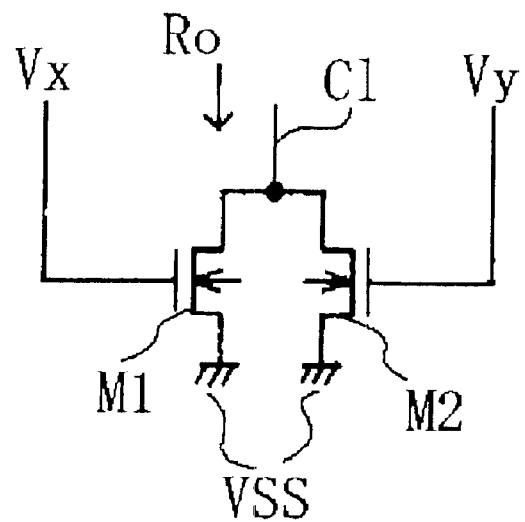
FIG. 11 is a circuit diagram showing still other example of a constitution of a common phase feedback circuit of the sample-and-hold circuit of FIG. 5.

A common phase feedback (common feedback) circuit 2 is provided between the first input terminal IN1 and the second input terminal IN2 of the completely differential type operational amplifier circuit 1. The common phase feedback circuit 2 is constituted by a common phase feedback hold capacitor CF1 provided between the first input terminal IN1 and a power source terminal VSS (0V), a second common phase feedback hold capacitor CF2 provided between the second input terminal IN2 and the power source terminal VSS, an N-channel type MOS transistor 21 a source terminal of which is connected to the power source terminal VSS and a gate terminal of which is connected to the first input terminal IN1 and an N-channel type MOS transistor 22 a source terminal of which is connected to the power source terminal VSS and a gate terminal of which is connected to the second input terminal IN2. Respective drain terminals of the MOS transistors 21 and 22 are connected to thereby constitute a control terminal CL. Similar to the constitution shown in FIG. 8, the control terminal CL is connected to an output bias circuit of an output portion of the completely differential type operational amplifier circuit 1 and provides the output bias circuit with an output bias control signal for uniquely maintaining a middle value of differential output signals from the first and the second output terminals OUT1 and OUT2.

Figure 2:
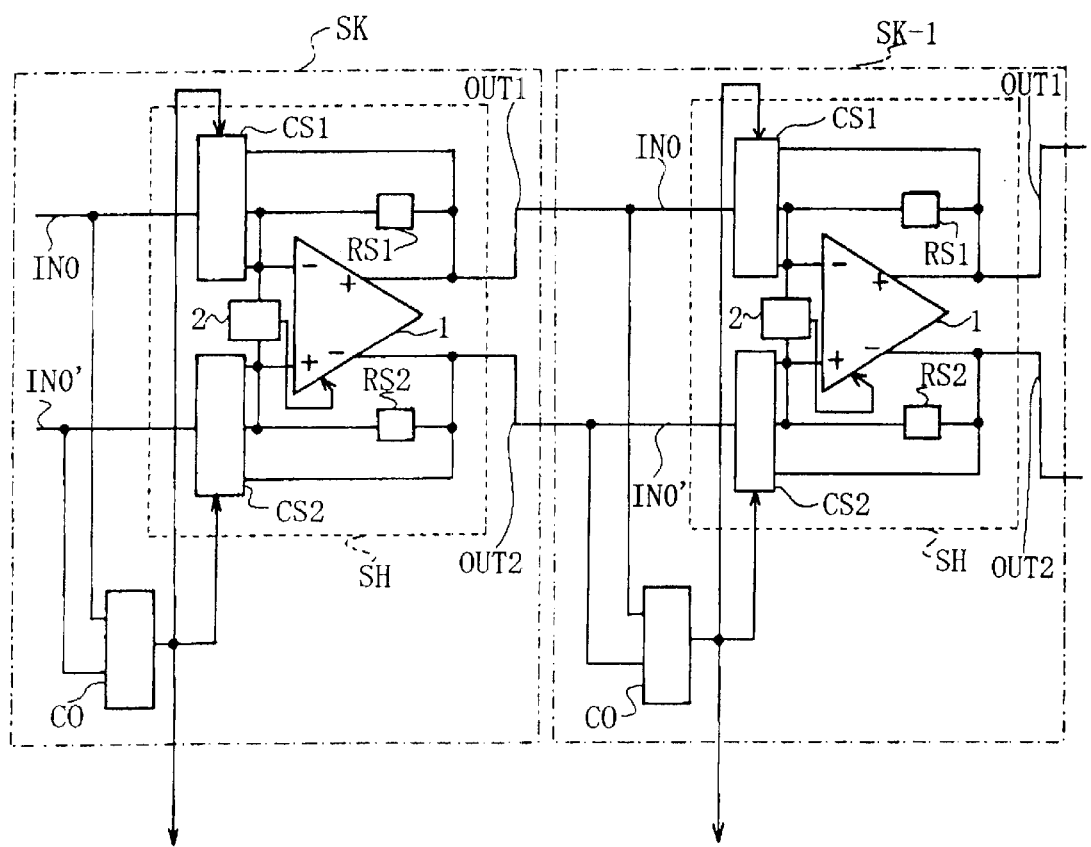
FIG. 2 is a block diagram showing a constitution of an A/D conversion cell of an A/D converter of a pipeline system using the sample-and-hold circuit of FIG. 1.
Figure 4:
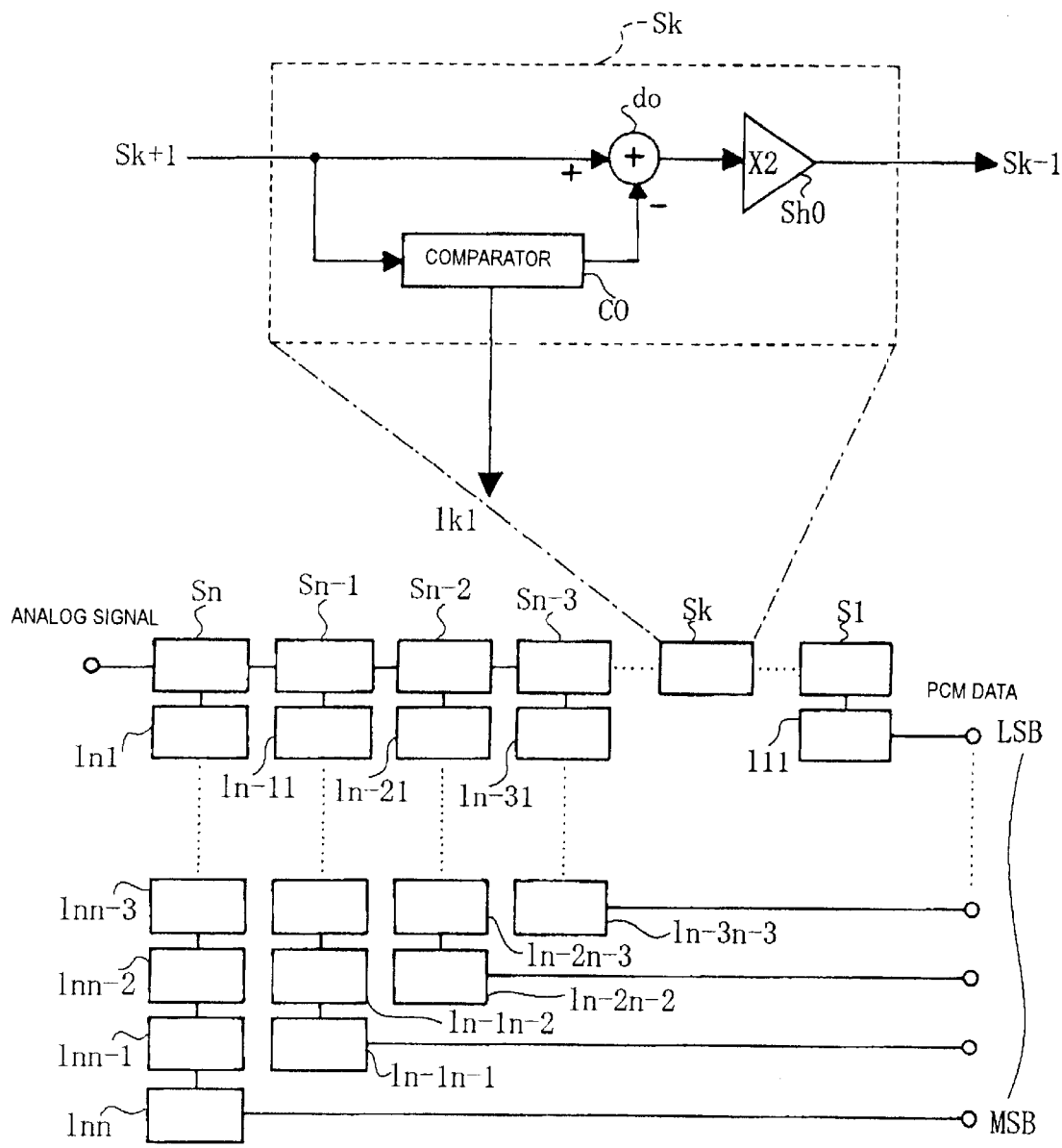
FIG. 4 is a block diagram showing a constitution of an A/D converter of a pipeline system.
Figure 5:
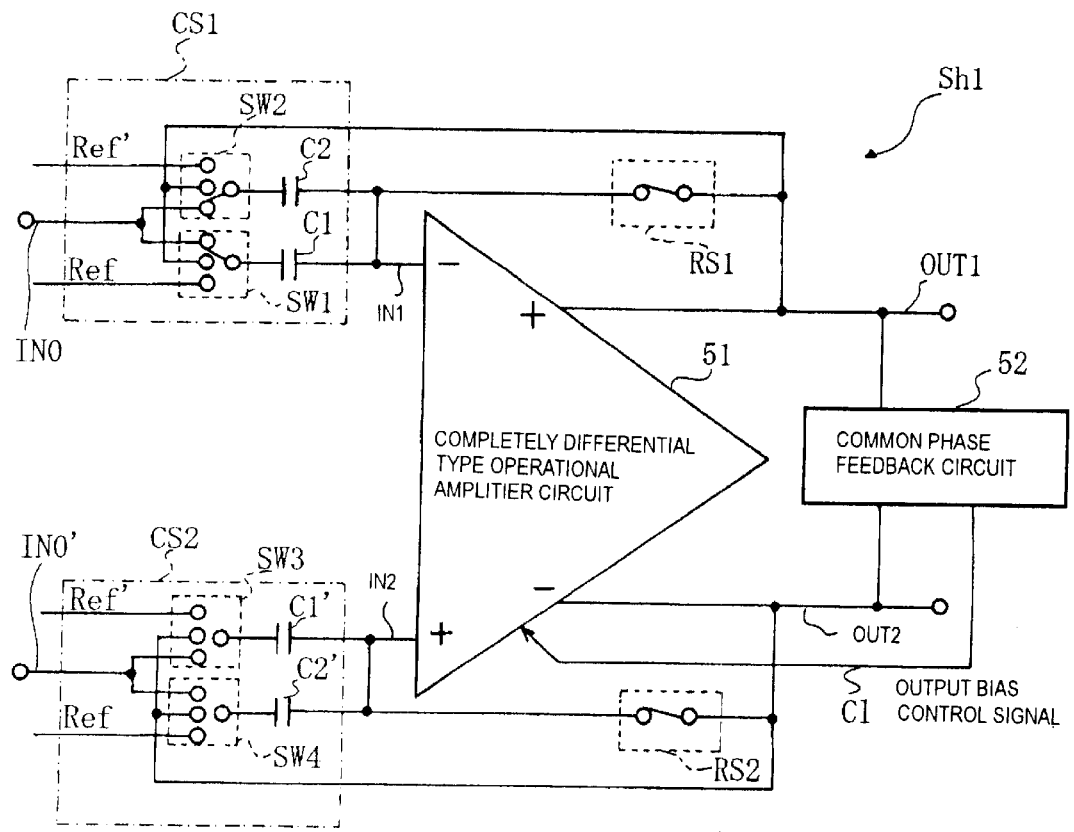
FIG. 5 is a circuit diagram showing a constitution of a conventional sample-and-hold circuit.
Figure 6:
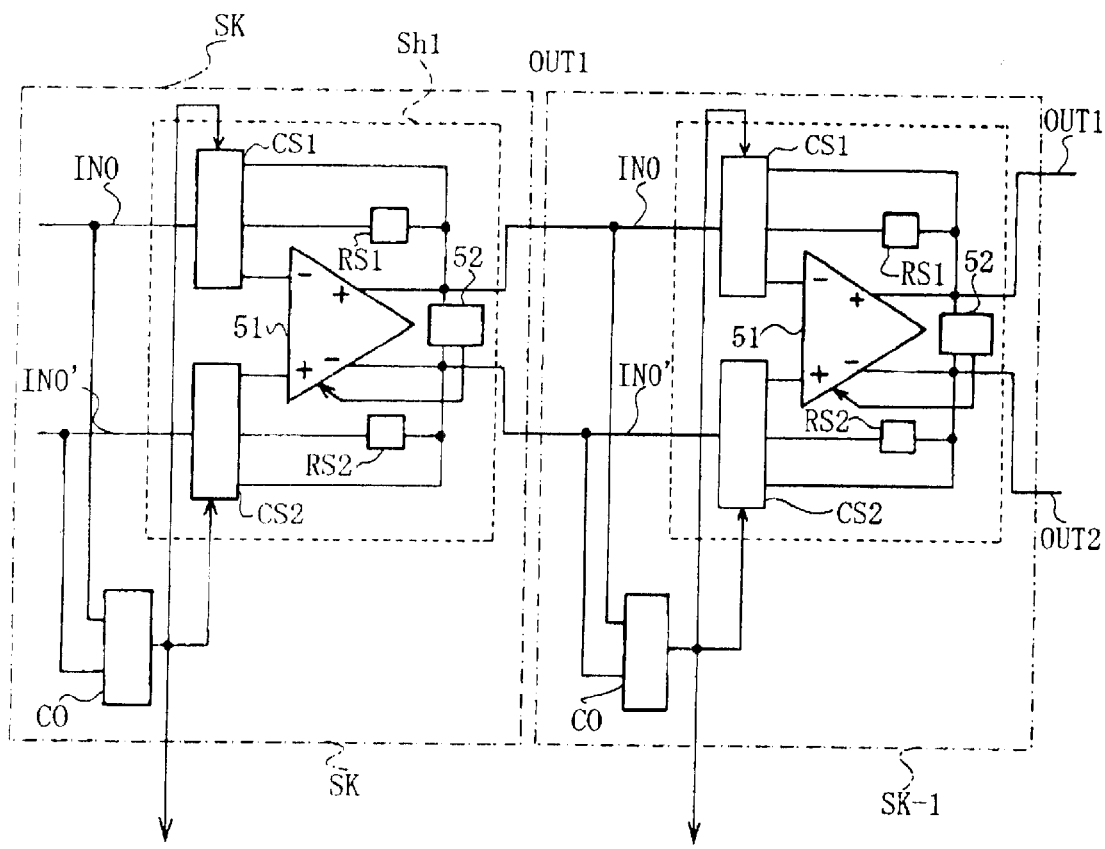
FIG. 6 is a block diagram showing a constitution of an A/D conversion cell of an A/D converter of a pipeline system using the sample-and-hold circuit of FIG. 5.
Figure 7A:
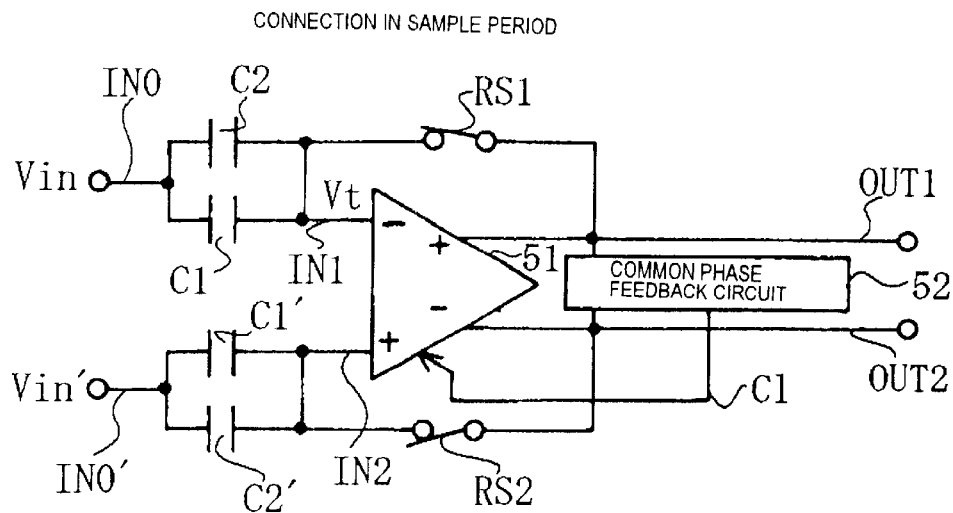
FIGS. 7A and 7B are circuit diagrams for explaining operation of the sample-and-hold circuit of FIG. 5.
Figure 7B:
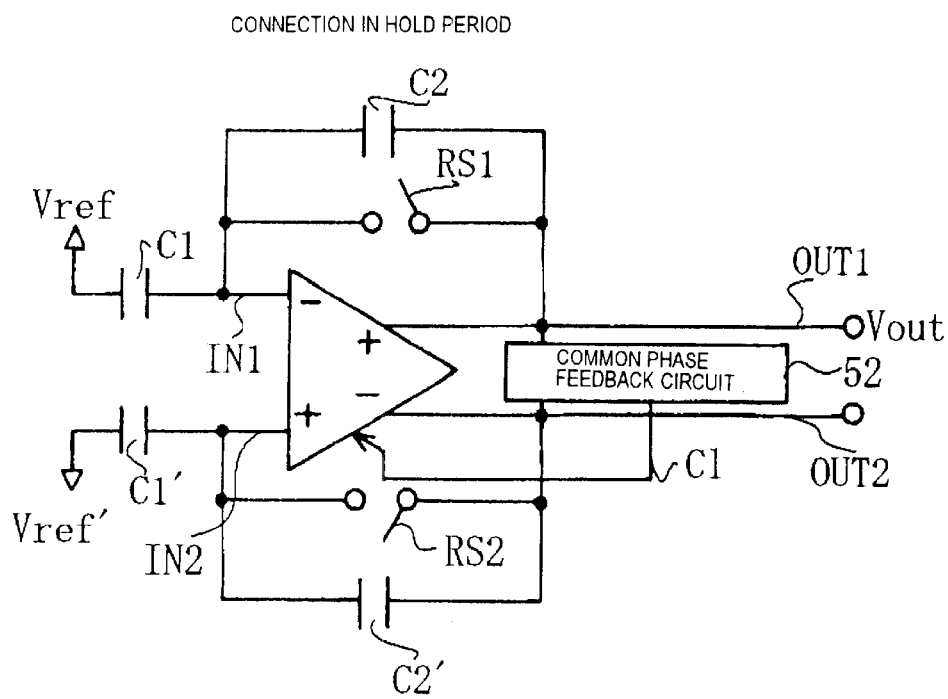

According to the example, basic constitution and operation with regard to sample and hold function are similar to those of the conventional sample-and-hold circuit sh1 shown in FIG. 5 such that the first and the second switch capacitor nets and the first and second reset switches are provided between the input terminals and the output terminals having polarities different from each other of the completely differential type operational amplifier circuit. As shown by FIG. 2, also in a sample-and-hold circuit SH of the example, the A/D conversion cell $S_k$ shown in FIG. 4 is constituted by connecting an input terminal of the comparator CO to the input terminals IN0 and IN0' and connecting the output terminals OUT1 and OUT2 to the input terminals IN0 and IN0' of the sample-and-hold circuit SH of the similar A/D conversion cell $S_{k-1}$ and the comparator CO to thereby constitute the A/D converter of the pipeline system. However, the example differs from the conventional constitution in that a connecting position of the common phase feedback circuit is disposed not between the output terminals of the completely differential type operational amplifier circuit but between the input terminals of the completely differential type operational amplifier circuit and that the common phase feedback hold capacitors are connected to the input terminals of the common phase feedback circuit. A description will be given of operation and effect by providing these in an explanation of operation of the example as follows.

An explanation will be given of operation of the example, particularly operation of the common phase feedback circuit 2 as follows.

Figure 3A:
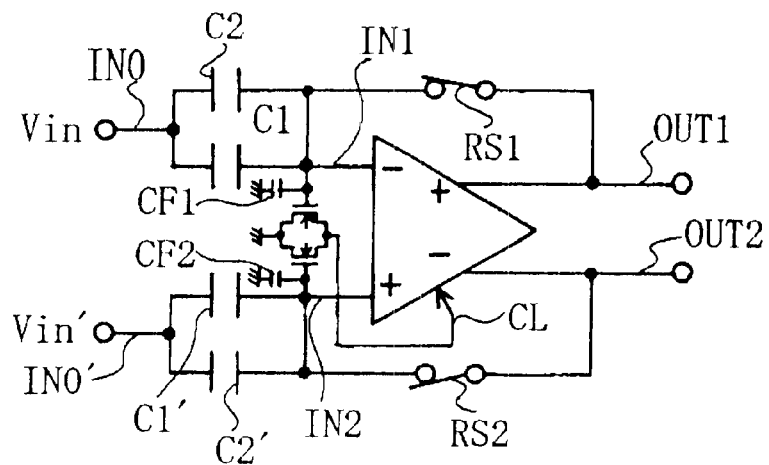
FIGS. 3A and 3B are circuit diagrams for explaining operation of the sample-and-hold circuit of FIG. 1.

First, during a sample period, as shown by FIG. 3A, the first and the second reset switches RS1 and RS2 are made ON, in the first switch capacitor net CS1, the switches SW1 and SW2 are made ON respectively to a side of the input terminal IN0, the capacitors C1 and C2 are conducted in parallel between the input terminal IN0 and the first input terminal IN1 of the completely differential type operational amplifier circuit 1 and are provided with input voltage Vin. In the second switch capacitor net CS2, the switches SW3 and SW4 are made ON respectively to a side of the input terminal IN0', and the capacitors C1' and C2' are conducted in parallel between the input terminal IN0' and the second input terminal IN2 of the completely differential type operational amplifier circuit 1 and are provided with input voltage Vin'.

Since the reset switches RS1 and RS2 are brought into a conductive state, the common phase feedback circuit 2 correctly receives the differential output signals of the completely differential operational amplifier circuit 1 and feeds back a control signal to maintain the middle value of the differential output signals to a balance point, to the output bias circuit of the completely differential operational amplifier circuit 1. When a voltage value of the input terminals IN1 and IN2 of the completely differential type operational amplifier circuit 1 at this occasion, is designated by notation Vt, the completely differential type operational amplifier circuit 1 is brought into a completely feedback state by the reset switches RS1 and RS2, a balance point $V_0$ in the case in which an amplitude of the differential output is null, is outputted and therefore, $Vt=V_0$.

Figure 3B:
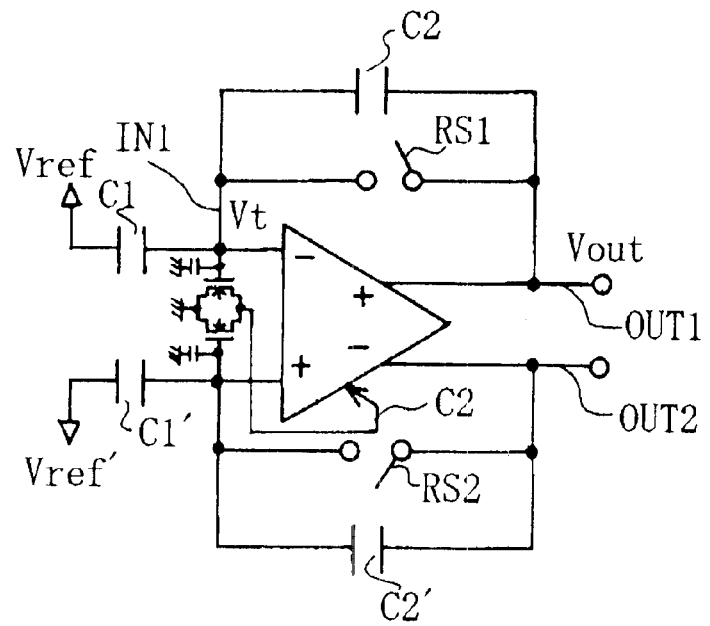

Next, during a hold period, as shown by FIG. 3B, the first and the second reset switches RS1 and RS2 are made OFF. In the first switch capacitor net CS1, the switch SW1 is made ON to a side of the reference voltage terminal Ref, the other terminal of the capacitor C1 is conducted to the reference voltage terminal Ref to thereby provide voltage Vref, the switch SW2 is made ON to a side of the first output terminal OUT1 to thereby conduct the other terminal of the capacitor C2 to the output terminal OUT 1, or the switch SW2 is made ON to the side of the reference voltage terminal Ref', the other terminal of the capacitor C2 is conducted to the reference voltage terminal Ref' to thereby provide power source Vref', and the switch. SW1 is made ON to the side of the first output terminal OUT1 to thereby conduct the other terminal of the capacitor C1 to the output terminal OUT1. In the second switch capacitor net CS2, the switch SW3 is made ON to the side of the reference voltage terminal Ref', the other terminal of the capacitor C1' is conducted to the reference voltage terminal Ref' to thereby provide voltage Vref', the switch SW4 is made ON to the side of the second output terminal OUT2 to thereby conduct the other terminal of the capacitor C2' to the output terminal OUT2, or the switch SW4 is made ON to the side of the reference voltage terminal Ref, the other terminal of the capacitor C2' is conducted to the reference voltage terminal Ref to thereby provide power source Vref and the switch SW3 is made ON to the second output terminal OUT2 to there by conduct the other terminal of the capacitor C1' to the output terminal OUT2. Thereby, from the output terminal OUT1 there is outputted 2Vin−Vref=Vout or 2Vin−Vref'=Vout and from the output terminal OUT2, there is outputted 2Vin'−Vref'=Vout' or 2Vin'−Vref=Vout'.

Here, the reset switches RS1 and RS2 are brought into a blocked state and therefore, the common phase feedback circuit is not operated, regardless of the amplitude of the output voltage during the hold period, the input terminals IN1 and IN2 of the completely differential type operational amplifier circuit 1 holds the input voltage $Vt=V_0$ during the sample period by the common phase feedback hold capacitors CF1 and CF2. Positive feedback is not carried out to the first input terminal of the completely differential type operational amplifier circuit during the hold period as in the related art constitution shown in FIG. 5. Therefore, the middle value of the differential output signals during the hold period is not change unstably.

As described above, according to the example, there is not brought about the positive feedback for making operation of the circuit unstable during the hold period, further, a variation in the balance point of the middle value of the differential output signals can be eliminated and erroneous operation of a circuit at a successive stage can be restrained.

When an A/D converter of a pipeline system is constituted by using the sample-and-hold circuit of the example, erroneous operation of a comparator at a successive stage can be restrained and there can be realized the A/D converter of the pipeline system excellent in stability and accuracy.

According to the invention, in the sample-and-hold circuit using the completely differential type operational amplifier circuit, there can be constituted the common phase feedback circuit necessary for the completely differential type operational amplifier circuit such that adverse influence is not effected to operation of the sample-and-hold circuit without increasing a number of circuit elements and the sample-and-hold circuit excellent instability and in accuracy can be provided.

That is, the positive feedback during the hold period can be eliminated, operation of the circuit can be stabilized, the variation in the balance point of the middle value of the differential output signals can be restrained regardless of the amplitude of the differential output signals and erroneous operation of a circuit at a successive stage can be restrained.

Further, when an A/D converter of a pipeline system is constituted by using the sample-and-hold circuit of the invention, erroneous operation of the comparator at a successive stage can be restrained and the A/D converter of the pipeline system excellent in stability and in accuracy can be realized.

What is claimed is:

1. A sample-and-hold circuit comprising:
   a completely differential type operational amplifier circuit;
   a first reset switch connected between a first input terminal constituting one of differential input terminals of the completely differential type operational amplifier circuit and a first output terminal constituting one of differential output terminals of the completely differential type operational amplifier circuit;
   a second reset switch connected between a second input terminal constituting other of the differential input terminals of the completely differential type operational amplifier circuit and a second output terminal constituting other of the differential output terminals of the completely differential type operational amplifier circuit;
   a first switch capacitor net connected between the first input terminal and the first output terminal and having a third input terminal; and
   a second switch capacitor net connected between the second input terminal and the second output terminal and having a fourth input terminal;
   wherein said sample-and-hold circuit is a sample-and-hold circuit constituting one set of differential input terminals by the third and the fourth input terminals and constituting one set of differential output terminals by the first and the second output terminals, further comprising:
   a common phase feedback circuit having a first and a second common phase feedback hold capacitor respectively connected to the first input terminal and the second input terminal and maintaining a middle value of output voltages of the first and the second output terminals to a predetermined value in accordance with voltages of the first and the second input terminals.

2. The sample-and-hold circuit according to claim 1:
wherein in the common phase feedback circuit, the first input terminal is connected to a gate terminal of a first MOS transistor and the first common phase feedback hold capacitor, other terminal of the first common phase feedback hold capacitor is grounded, a source terminal of the first MOS transistor is grounded or connected to a power source terminal, the second input terminal is connected to a gate terminal of a second MOS transistor and the second common phase feedback hold capacitor, other terminal of the second common phase feedback hold capacitor is grounded, a source terminal of the second MOS transistor is grounded or connected to a power source terminal, a drain terminal of the first MOS transistor and a drain terminal of the second MOS transistor are connected to thereby constitute a control terminal and the middle value of the output voltage of the first and the second output terminals is maintained to the predetermined value in accordance with an output from the control terminal.

3. An A/D converter of a pipeline system, wherein in a plurality of the sample-and-hold circuits according to claim 1 or 2, the differential output terminals of the sample-andhold circuit at a preceding stage are connected to the sample-and-hold circuit at a successive stage as the differential input terminals and an output of a point of connecting the differential output terminal and the differential input terminal, is compared with a predetermined reference value to thereby provide values of respective bits of PCM data.

* * * * *